United States Patent [19]

Osaka et al.

[11] 4,399,386

[45] Aug. 16, 1983

[54] ROTATIVE MOTOR USING PLURAL ARRAYS OF PIEZOELECTRIC ELEMENTS

[75] Inventors: Susumu Osaka; Minoru Toda, both of Machida, Japan

[73] Assignee: RCA Corporation, New York, N.Y.

[21] Appl. No.: 347,790

[22] Filed: Feb. 11, 1982

[51] Int. Cl.³ .............................................. H01L 41/08
[52] U.S. Cl. .................................. 310/328; 310/331; 310/321
[58] Field of Search ............... 310/311, 321, 323, 328, 310/330–332

[56] References Cited

U.S. PATENT DOCUMENTS 2,195,417 4/1940 Mason .
3,297,889 1/1967 Breskend .
3,781,955 1/1974 Lavrinenko et al. .
4,019,073 4/1977 Vishnevsky et al. .
4,339,682 7/1982 Toda et al. ...................... 310/332 X

FOREIGN PATENT DOCUMENTS 143682 9/1980 Fed. Rep. of Germany ...... 310/328

OTHER PUBLICATIONS

Paper by G. Arlt, et al., presented to "Electromechanical Design", published in Oct. 1972.

Primary Examiner—Mark O. Budd
Attorney, Agent, or Firm—Glenn H. Bruestle

[57] ABSTRACT

A rotative motor includes a member mounted to rotate freely. A plurality of piezoelectric bimorph elements are radially secured at one end to a support in a two-staged shape comprising upper and lower arrays of the elements. A plurality of elastic members connect the free end of each one of the upper elements with the free end of a different one of the lower elements. Each pair of inter-connected elements is excited from a source of alternating current so that the free ends of the respective elements vibrate ninety degrees out of phase. The central point of each elastic member connected between the free ends of the one upper and one lower elements is in frictional contact with the rotatable member. The central point of each elastic member exhibits a closed loop path, imparting a rotary motion to the rotatable member.

1 Claim, 10 Drawing Figures

ROTATIVE MOTOR USING PLURAL ARRAYS OF PIEZOELECTRIC ELEMENTS

This invention relates to an improved rotative motor, and particularly, to an improved rotative motor using the vibration effect of a triangular piezoelectric element.

BACKGROUND OF THE INVENTION

Disclosed in a U.S. application Ser. No. 189,354 filed on Sept. 22, 1980 by Toda and Osaka now U.S. Pat. No. 4,339,682, issued July 13, 1982 is a rotative motor which converts electrical energy into mechanical energy without employing magnetic circuits by utilizing a pair of piezoelectric bimorph elements.

In any motor, it is desirable that all the input electric power be efficiently converted to mechanical output power without being consumed by various types of losses. In the peizoelectric bimorph motor, an electric oscillator is often used to drive the bimorph. Thus, if the motor is highly efficient the oscillator circuit current is reduced so that, if a battery is used, the battery life is lengthened.

Another requirement of a motor is to increase the output power without increasing the motor volume. To do so in the piezoelectric bimorph motor, many bimorph elements have to be closely packed, and it is desirable that all the elements effectively drive the rotor.

SUMMARY OF THE INVENTION

A rotative motor is provided which utilizes a plurality of piezoelectric bimorph elements radially arranged in a two-staged shape comprising upper and lower arrays of bimorph elements by a supporting member. A plurality of elastic members are provided, each of which connects the free end of one of the upper elements with the free end of a different one of the lower elements, with a central point of each elastic member in frictional contact with a rotary member. Each pair of inter-connected bimorph elements is driven from a suitable source of alternating current so that a phase difference of the vibration at the respective free ends connected by the elastic member imparts through the elastic member a continuous rotary motion to the rotary member.

DESCRIPTION OF THE PREFERRED EMBODIMENT

Piezoelectric material is known to expand and contract in accordance with the direction of polarization thereof, according to the polarity of an electric field applied thereto. An element can be made of piezoelectric material so that it will bend according to the instantaneous value of an applied electric field. Ceramic materials, for example, PZT, are known which exhibit a piezoelectric effect. An alternating current voltage applied to a bimorph comprising two layers of such ceramic material causes the ceramic layers of the bimorph to expand or contract depending upon the sign of the voltage. Thus, if a bimorph element is formed of ceramic material with one end fixed to a suitable support structure, the free end vibrates at a frequency determined by the frequency of the alternating current voltage applied to the bimorph.

Now, the difference in the characteristics between a triangular bimorph and a rectangular bimorph will first be explained.

Figures 1A, 1B:
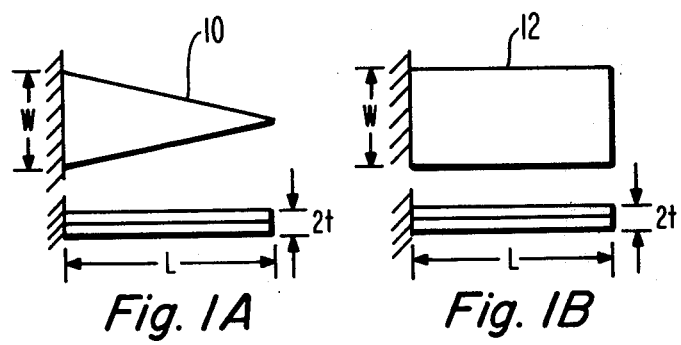
FIGS. 1A and 1B, FIGS. 2A and 2B and FIGS. 3A and 3B show comparative properties of triangular and rectangular bimorphs.

In FIGS. 1A and 1B, a triangular bimorph 10 and a rectangular bimorph 12 are shown. Each has the same length L, the same width W at the support end, the same thickness t of a bimorph half layer, the same Young's modulus Y, and the same piezoelectric strain constant $d_{31}$, where Y and $d_{31}$ are characteristics for the PZT. The area or volume of the triangular bimorph 10 is half that of the rectangular bimorph 12. By alternating current voltage excitation, the free edge vibrational amplitude shows a peak at the resonance condition. The resonant frequency $\omega_{to}$ of the triangular bimorph 10, for a material with density $\rho$, is given by $$\omega_{to} = \frac{7.156t}{L^2} \sqrt{Y/3\rho} \tag{1}$$

On the other hand, the resonant frequency $\omega_r$ of the rectangular bimorph 12, for the same material, is given by $$\omega_{ro} = \frac{3.473t}{L^2} \sqrt{Y/3\rho} \tag{2}$$

Therefore, the resonant frequency for the triangular bimorph 10 is 2.06 times larger than that for the rectangular bimorph 12. The alternating current voltage-induced deflection displacement y at the tip is the same for both the triangular bimorph 10 and the rectangular bimorph 12, and is given by $$y = \frac{3}{4} \frac{L^2}{t^2} d_{31} V, \tag{3}$$

where V is the peak value of applied voltage. The necessary force to return the displacement to the original position, the generated force $F_t$ or $F_r$ for the triangular bimorph 10 or the rectangular bimorph 12 is given by respectively $$F_t = Y \frac{tw}{L} d_{31} V, \tag{4}$$

$$F_r = \frac{3}{2} Y \frac{tw}{L} d_{31} V, \tag{5}$$

The dielectric loss $P_{td}$ or $P_{rd}$ for the triangular bimorph 10 or the rectangular bimorph 12 is given by, respectively, $$P_{td} = \omega_{to} C_t \frac{V^2}{2} \tan \delta, \tag{6}$$

$$P_{rd} = \omega_{ro} C_r \frac{V^2}{2} \tan \delta, \tag{7}$$

where $C_t$ or $C_r$ is the total capacitance between electrodes coated on both sides of each layer forming the bimorph 10 or the bimorph 12, and the magnitude of $C_t$ is half that of $C_r$. The $\delta$ is the loss angle due to the dielectric loss.

Figure 4A:
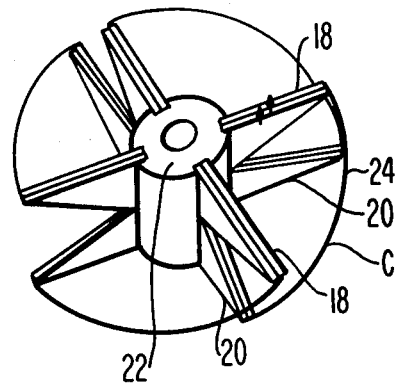
FIGS. 4A and 4B show one embodiment of the present invention.
Figure 4B:
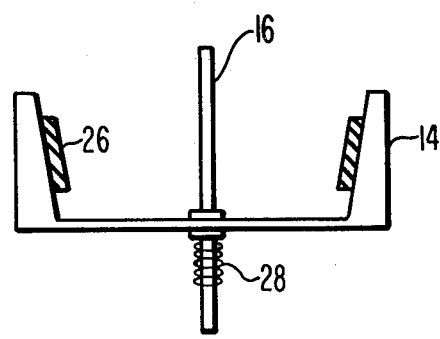

Referring to FIGS. 4A and 4B, a rotary member 14 is constructed and mounted to freely rotate clockwise or counterclockwise about an axis 16. A plurality of triangular piezoelectric bimorph elements 18 and 20, which may be constructed of a piezoelectric ceramic material, for example, are radially disposed in a two-staged arrangement comprising upper and lower arrays of bimorph elements mounted at their short sides to a supporting member 22. Although the bimorph elements 18 and 20 are illustrated as triangular, they may be rectangular as hereinabove disclosed.

The bimorph elements 18 form the upper array and the bimorph elements 20 form the lower array. The supporting member 22 is engaged with the axis 16 so as not to rotate thereabouts. The the free tip or end of one upper element 18 is connected by an elastic member 24 arcuate in shape, for example, a steel wire yoke, to the free tip of one lower element 20. The angle between any two inter-connected bimorphs 18 and 20 is not critical for producing rotation. In FIG. 4A, the angle is, by way of example, roughly 90 degrees. The elastic member 24 is firmly bonded to the free tips of the respective bimorph elements 18 and 20. The central point C of the elastic member 24 frictionally contacts the surface of the rotary member 14. Each pair comprising one upper element 18 and one lower element 20 is driven from an alternating current power source (not shown).

In FIG. 4A, it is assumed that the respective two layers of the bimorph element 18 or 20, have the same polarization, for example, orthogonal to the electrode surfaces coated on opposite sides of each layer as shown by a solid arrow indicating the direction of polarization of the layers. One terminal of the alternating current power source is connected to the inner electrodes of each layer of the bimorph element 18 or 20, a second terminal of the alternating current power source being connected to the outer electrodes of each layer of the element 18 or 20, respectively. Therefore, the two layers of the bimorph element 18 or 20 are respectively driven by a different polarity of the applied electric field. Thus, the free ends of the respective bimorph elements 18 and 20 vibrate at a frequency determined by the frequency of the alternating current source. The vibration amplitude is a maximum near the mechanical resonance of the piezoelectric element structures.

The central point C of the elastic member 24 moves as a function of the combined vibrations at the free ends of the interconnected bimorph elements 18 and 20. When the vibration component at the free end of one bimorph element 18 is 90° out of phase with the vibration component at the free end of the other bimorph element 20, the generated physical displacement of the point C is circular in shape. Thus, if the central point C is in frictional contact with the surface of the rotary member 14, the physical displacement at point C will impart a rotary motion to the member 14. The speed of rotation will depend upon the vibrational frequencies and amplitudes of the bimorph elements 18 and 20. The direction of the rotation of the member 14 will depend upon whether the phase of vibration for one of the bimorph elements 18 leads or lags by 90° the phase of the vibration of the other bimorph element 20.

Figure 5A:
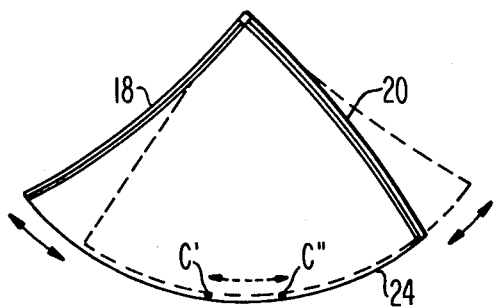
FIGS. 5A and 5B illustrate the operation of the embodiment shown in FIGS. 4A and 4B.
Figure 5B:
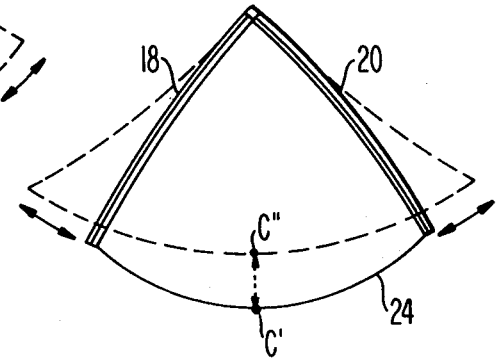

In FIG. 5A, the solid arrows indicate the vibrational direction of the respective bimorph elements 18 and 20. The broken arrow indicates a displacement of the central point C of the elastic member 24. If the bimorph elements 18 and 20 are driven by an alternating current power source to vibrate in the same phase, the central point C of the elastic member 24 simply moves on a line between point C' and C'' as shown in FIG. 5A. When the bimorph elements 18 and 20 are driven by the alternating current power source to vibrate 180° out of phase, the central point C of the elastic member 24 moves along a line C', C'' as shown in FIG. 5B, which is perpendicular to the line C', C'' in FIG. 5A. Thus, if the vibrating phases of the two bimorph elements 18 and 20 are 90° out of phase, the locus of motion of the central point C of the elastic member 24 is a closed loop path, e.g., a circle.

The rotational direction of the rotary member 14 depends on the rotational direction of the central point C of the elastic member 24. When the central point C of the elastic member 24 frictionally contacts the surface of the rotary member 14, the rotary member 14 will rotate in a direction according to the phase relationship between the two vibrating bimorph elements 18 and 20 at a constant speed. To improve the frictional contact between the elastic member 24 and the rotary member 14, the inside of the member 14, which may be of a metal construction, may be coated by a frictional material such as rubber and/or a small piece of a rubber plate 26 can be attached at point C to the elastic member 24. To further improve the friction between the elastic member 24 and the rotary member 14, a spring 28 produces a constant force between the driven point C on the elastic member 24 and the surface of the rotary member 14.

Figures 2A, 2B:
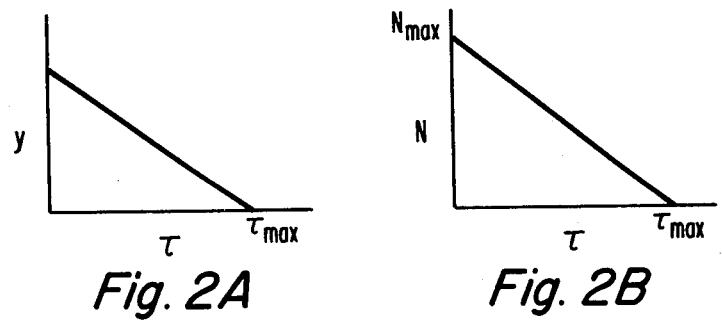

The motor characteristic can be analyzed by using a simple model wherein a first bimorph vibrator is at the resonant condition and a second bimorph vibrates with a phase lag. At the time when the vibrational velocity of the first bimorph becomes maximum, the steel wire yoke inter-connecting the first and second bimorphs touches a rotary member to cause rotation. The amplitude of the resonant vibration of the first bimorph is limited by force reaction from the rotary member. When the motor is heavily loaded so that a large torque is being generated, the reaction force is large and the amplitude of vibration is decreased. According to the analysis, the vibrational amplitude y decreases linearly with increasing output torque ($\tau = F \cdot (D/2)$ or increasing load, as shown in FIG. 2A, where F is the generated force caused by an applied voltage and D is the diameter of the rotary member. The rotation speed of the rotary member at the periphery of the rotary member is approximately equal to the maximum vibration speed ($S = \omega_o y$) of the bimorph's free edge at the time when the steel wire yoke touches the rotary member's periphery, where $\omega_o$ is the resonant frequency. Therefore, the rotation speed N(rpm) of the rotary member is $N = 60 \omega_o y / \pi D$. The value of N is a maximum at $\tau = o$ and linearly decreases from $N_{max}$ with increasing output torque $\tau$(gram. cm) and, finally, N becomes zero at $\tau = \tau_{max}$, as shown in FIG. 2B. The mechanical output power $P_{out}(= N \cdot \tau)$ varies in a functional form $N_{max}(1 - (\tau/\tau_{max})\tau$ and is shown by the curve in FIGS. 3A and 3B. Since the resonant frequency for a triangular bimorph is 2.06 times larger than that for a rectangular bimorph, and y is the same for both as previously stated, $N_{max}$ is 2.06 times larger for the triangular one. However, $\tau_{max}$ of the triangular bimorph is $\frac{2}{3}$ of rectangular one, since the generated force for the triangular bimorph is ($\frac{2}{3}$) that for the rectangular bimorph, and y is the same for both. Therefore, $P_{max}(=N_{max}\cdot\tau_{max}/4)$ for the triangular bimorph is 1.373 times larger than for the rectangular one.

Figures 3A, 3B:
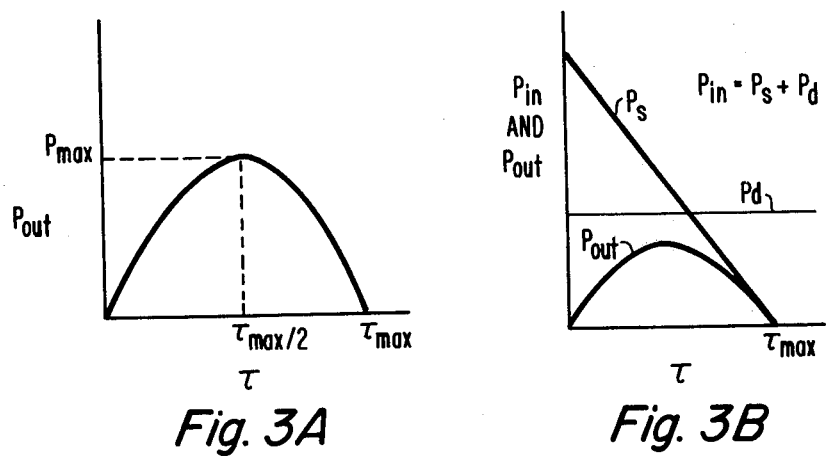

On the other hand, the input power to the bimorph is composed of two components, one is the power dissipation caused by dielectric loss $P_d$, and the other is the piezoelectric strain induced power consumption $P_s$, which appears only when the piezoelectric material is strained by the vibration. $P_s$ is proportional to y and decreases linearly with increasing $\tau$, but $P_d$ is independent of output torque $\tau$, as shown in FIG. 3B. The total efficiency $\eta$ is given by $\eta = P_{out}/(P_s + P_d)$. Herein, $P_{out}$ is larger for the triangular one, but $P_s$ is also larger by the same ratio. However, $P_d(=\omega_o C(V^2/2)\tan\delta)$ is almost the same, since C is ½ and $\omega_o$ is 2.06 times those for the rectangular bimorph as beforementioned. Therefore, the efficiency for the triangular bimorph motor is at most 1.373 times that of the rectangular bimorph motor. The larger difference in efficiencies between the two types is seen when $P_s<<P_d$ at the larger output torque region. In summary, less material volume, higher speed, higher output, less torque, and higher efficiency are obtained for the triangular bimorph motor compared to the rectangular bimorph motor.

In addition to high power output in a small volume structure, the two-staged structure shown in FIG. 4A is advantageous for balancing out the pressure force between the rotary member axis and pivot due to the drive point of the steel wire yoke. In a one-pair bimorph structure, the driving steel wire yoke pushes the rotary member to one side and the pivot receives the force.

Another advantage of the structure shown in FIG. 4A is the small wear of the driving steel wire yoke and the rotary member surface. To increase the output mechanical force by a single pair of bimorph structure, the pressure of the drive point against the rotary member surface has to be increased. The amount of wear is proportional to the pressure, when the pressure is less than the threshold value. But the wear increases more drastically above the threshold. Therefore, the wear is smaller for the larger number of drive point for the same total output force.

In a typical construction of the embodiment shown in FIGS. 4A and 4B, a piezoelectric bimorph element 18 or 20 can be a ceramic bimorph 2 mm wide at the support side, 16 mm long and 0.6 mm thick. The alternating current voltage is 100 volts and 1 mA at a frequency of 790 Hz with force factor $\cos\phi$ of 0.25, causing the rotation speed of 800 revolutions per minute with no load or nearly zero rpm with a torque of 3 gram-cm when only one pair of bimorph elements 18 and 20 is used.

What is claimed is:

1. In combination,
   a rotatable member,
   a plurality of piezoelectric elements radially secured at one end to a support in a two-staged shape comprising upper and lower arrays of said elements, the opposite ends of said elements being free to vibrate,
   a plurality of elastic members each connecting the free end of each one of said upper elements with the free end of a different one of said lower elements, with a central point of each elastic member in frictional contact with the surface of said rotatable member, and
   means for exciting each pair of said inter-connected elements to cause by a phase difference of the vibration at the respective free ends of said inter-connected elements the central point of said respective elastic member to have a closed loop path to rotate said rotatable member in a direction determined by said phase difference.

* * * * *